US008749030B2

(12) United States Patent
Raring et al.

(10) Patent No.: US 8,749,030 B2
(45) Date of Patent: *Jun. 10, 2014

(54) SURFACE MORPHOLOGY OF NON-POLAR GALLIUM NITRIDE CONTAINING SUBSTRATES

(71) Applicants: James W. Raring, Goleta, CA (US); Christiane Elsass, Goleta, CA (US)

(72) Inventors: James W. Raring, Goleta, CA (US); Christiane Elsass, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/621,485

(22) Filed: Sep. 17, 2012

(65) Prior Publication Data

US 2013/0016750 A1 Jan. 17, 2013

Related U.S. Application Data

(63) Continuation-in-part of application No. 13/548,635, filed on Jul. 13, 2012, now Pat. No. 8,575,728, which is a continuation of application No. 12/497,289, filed on Jul. 2, 2009, now Pat. No. 8,247,887.

(60) Provisional application No. 61/182,107, filed on May 29, 2009.

(51) Int. Cl.
*H01L 29/04* (2006.01)
*H01L 33/16* (2010.01)

(52) U.S. Cl.
CPC ............... *H01L 29/04* (2013.01); *H01L 33/16* (2013.01)
USPC ......................................................... 257/628

(58) Field of Classification Search
CPC ........................... H01L 29/04; H01L 33/16
USPC ............. 257/627–628; 117/101–104; 372/44; 438/479, 998, 46

See application file for complete search history.

(56) References Cited

U.S. PATENT DOCUMENTS

| 5,663,592 A * | 9/1997 | Miyazawa et al. ............ 257/627 |
| 5,698,880 A * | 12/1997 | Takahashi et al. ............ 257/341 |
| 5,736,753 A * | 4/1998 | Ohno et al. ...................... 257/77 |
| 5,864,171 A * | 1/1999 | Yamamoto et al. ............ 257/628 |
| 6,547,249 B2 | 4/2003 | Collins, III et al. |
| 6,734,461 B1 * | 5/2004 | Shiomi et al. .................... 257/77 |
| 7,390,359 B2 * | 6/2008 | Miyanaga et al. ................ 117/2 |
| 8,494,017 B2 | 7/2013 | Sharma et al. |
| 8,524,578 B1 | 9/2013 | Raring et al. |

OTHER PUBLICATIONS

USPTO Office Action for U.S. Appl. No. 12/995,946 dated Aug. 2, 2013, 16 pages.
USPTO Notice of Allowance for U.S. Appl. No. 13/548,770 dated Jun. 25, 2013, 6 pages.

* cited by examiner

*Primary Examiner* — Nathan Ha
(74) *Attorney, Agent, or Firm* — Kilpatrick Townsend & Stockton LLP

(57) ABSTRACT

Optical devices such as LEDs and lasers are discloses. The devices include a non-polar gallium nitride substrate member having an off-axis non-polar oriented crystalline surface plane. The off-axis non-polar oriented crystalline surface plane can be up to about −0.6 degrees in a c-plane direction and up to about −20 degrees in a c-plane direction in certain embodiments. In certain embodiments, a gallium nitride containing epitaxial layer is formed overlying the off-axis non-polar oriented crystalline surface plane. In certain embodiments, devices include a surface region overlying the gallium nitride epitaxial layer that is substantially free of hillocks.

18 Claims, 16 Drawing Sheets

CLADDING GROWN WITH $H_2$ CARRIER GAS

CLADDING GROWN WITH $N_2$ CARRIER GAS $H_2$: RMS = 0.49nm $N_2$: RMS = 0.10nm

SURFACE MORPHOLOGY OF NON-POLAR GALLIUM NITRIDE CONTAINING SUBSTRATES

This application is a continuation in part of U.S. application Ser. No. 13/548,635 filed on Jul. 13, 2012, which is a continuation of U.S. application Ser. No. 12/497,289 filed on Jul. 2, 2009, which issued as U.S. Pat. No. 8,247,887 on Aug. 21, 2012, and which claims priority to U.S. Provisional Application No. 61/182,107 filed on May 29, 2009, each of which is incorporated by reference in its entirety.

BACKGROUND

The present invention is directed to optical devices and related methods. More particularly, the present invention provides a method and device for fabricating crystalline films for emitting electromagnetic radiation using non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the conventional light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional Edison light bulb.

First, the conventional light bulb dissipates much thermal energy. More than 90% of the energy used for the conventional light bulb dissipates as thermal energy.

Secondly, reliability is an issue since the conventional light bulb routinely fails often due to thermal expansion and contraction of the filament element.

Thirdly, light bulbs emit light over a broad spectrum, much of which does not result in bright illumination due to the spectral sensitivity of the human eye.

Lastly, light bulbs emit in all directions and are not ideal for applications requiring strong directionality or focus such as projection displays, optical data storage, or specialized directed lighting.

In 1960, Theodore H. Maiman demonstrated the first laser at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application. These and other limitations may be described throughout the present specification and more particularly below.

From the above, it is seen that techniques for improving optical devices is highly desired.

BRIEF SUMMARY

According to the present invention, techniques related generally to optical devices are provided. More particularly, the present invention provides a method and device for fabricating crystalline films for emitting electromagnetic radiation using non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices. In a preferred embodiment, the optical device is a laser that has been configured for blue and green emissions, as well as others. In still a preferred embodiment, the optical device is an LED that has been configured for blue emission, as well as others.

In a specific embodiment, the present invention provides a method and resulting nonpolar m-plane (10-10) oriented gallium nitride structure having smooth surface morphology, which is often substantially free from hillocks and the like. In one or more embodiments, the method includes using a miscut or offcut surface or no miscut or offcut or other off-axis orientation of a non-polar m-plane surface orientation as a growth surface region. In a preferred embodiment, the epitaxial layer is configured using at least an atmospheric pressure (e.g., 650-850 Torr) epitaxial formation process, but may also be configured for other processes. In a specific embodiment, the method includes use of a $N_2$ carrier and subflow gas, which is substantially all $N_2$, as a medium for precursor gases, which form the crystalline gallium nitride epitaxial material. The growth using the substantially predominant $N_2$ gas leads to formation of crystalline gallium nitride epitaxial material substantially free of hillocks and the like. As used herein, the term "nonpolar (10-10) oriented gallium nitride structure" refers to the family of nonpolar m-plane (10-10) oriented gallium nitride structures and the like.

In an alternative preferred embodiment, the present invention includes use of a gallium nitride substrate configured in a non-polar (10-10) surface orientation that has a miscut toward the c-plane (0001) ranging from about −0.6 degrees to about −2.0 degrees and any miscut toward the a-plane (11-20) although there can be other orientations and degrees of miscut or offcut or off-axis orientation. In one or more embodiments, the method uses an $H_2$ carrier gas and combination of $H_2$ and $N_2$ subflow gases in further combination with precursor gases for growth of crystalline gallium nitride epitaxial material. In still a preferred embodiment, the miscut can be about −0.8 degrees to about −1.1 degrees toward the c-plane (0001) and between −0.3 degrees and 0.3 degrees toward the a-plane (11-20) to cause formation of an overlying gallium nitride epitaxial layer with smooth morphology.

Still further, the present invention provides an optical device that has epitaxial film that is substantially free from morphological features on the surface such as hillocks and the like. In a specific embodiment the device has a non-polar (10-10) gallium nitride substrate member having a slightly off-axis non-polar oriented crystalline surface plane. In one or more embodiments, the slightly off-axis (or on-axis) non-polar oriented crystalline surface plane ranges from about 0 degrees to a predetermined degree toward either or both the c-plane and/or a-plane. In a specific embodiment, the device has a gallium nitride containing epitaxial layer formed overlying the slightly off-axis non-polar oriented crystalline surface plane. A surface region is overlying the gallium nitride epitaxial layer. In a preferred embodiment, the surface region being substantially free from hillocks having an average spatial dimension of, for example, 10-100 microns and greater, but can be other dimensions. In a preferred embodiment, the epitaxial layer is configured using at least an atmospheric pressure (e.g., 650-850 Torr) epitaxial formation process. In a specific embodiment, the epitaxial layer comprises one or more layers which form at least a quantum well of at least 1.5 nanometers and greater or at least 3.0 nm or at least 5.0 nm nanometers and greater. The quantum well, which is thicker, leads to improved laser devices.

Still further, the present invention provides a method of fabricating an optical device. The method includes providing a non-polar (10-10) gallium nitride substrate member having a slightly off-axis non-polar oriented crystalline surface plane. In a specific embodiment, the slightly off-axis non-polar oriented crystalline surface plane is greater in magnitude than about negative 0.6 degrees toward the c-plane (0001). The method includes forming a gallium nitride containing epitaxial layer having a smooth surface region substantially free of hillocks overlying the slightly off-axis non-polar oriented crystalline surface plane.

In yet other embodiments, the present invention provides a method of fabricating an alternative optical device. The method includes providing a non-polar (10-10) gallium nitride substrate member having a slightly off-axis non-polar oriented crystalline surface plane in a specific embodiment. The slightly off-axis non-polar oriented crystalline surface plane ranges from about 0 degrees to a predetermined degree toward either or both the c-plane or a-plane. In a specific embodiment, the present method includes forming a gallium nitride containing epitaxial layer, using at least an atmospheric pressure (e.g., 700-800 Torr) epitaxial process to form at least a quantum well having a thickness of at least 1.5 or 3.5 nanometers and greater. Preferably, the gallium nitride epitaxial layer has a surface region substantially smooth and free from hillocks.

In a specific embodiment, the present invention provides a method and resulting in an off-cut from an m-plane (10-10) oriented gallium nitride structure having smooth surface morphology, which is often substantially free from hillocks and the like. In an example, the off-cut can be up to about +/−21 degrees toward a c-plane and/or +/−10 degrees toward an a-plane, such that the orientations may be considered an exposed semi-polar plane. Examples of such semipolar planes would (30-31), (30-3-1), (20-21), (20-2-1), (30-32), and (30-3-2), among others. In a preferred embodiment, the epitaxial layer is configured using at least an atmospheric pressure (e.g., 650-850 Torr) epitaxial formation process, but may also be configured for other processes. In a specific embodiment, the method includes use of a $N_2$ carrier and subflow gas, which is substantially all $N_2$, as a medium for precursor gases, which form the crystalline gallium nitride epitaxial material. The growth using the substantially predominant $N_2$ gas leads to formation of crystalline gallium nitride epitaxial material substantially free of hillocks and the like.

In yet other embodiments, the present invention provides a method of fabricating an alternative optical device. The method includes providing a non-polar (10-10) m-plane gallium and nitrogen containing substrate member having an off-cut to provide an off-axis oriented crystalline surface plane in a specific embodiment. In an example, the off-cut or off-set can be up to about +/−20 degrees toward a c-plane and/or +/−10 degrees toward an a-plane, such that the orientations may be considered an exposed semi-polar plane. Examples of such semipolar planes would (30-31), (30-3-1), (20-21), (20-2-1), (30-32), and (30-3-2), among others. In a specific embodiment, the present method includes forming a gallium nitride containing epitaxial layer, using at least an atmospheric pressure (e.g., 650-850 Torr) epitaxial process to form at least a quantum well having a thickness of at least 1.5, 3.5, or 5.0 nanometers and greater. Preferably, the gallium nitride epitaxial layer has a surface region substantially smooth and free from hillocks.

In yet other embodiments, the present invention provides a method of fabricating an alternative optical device. The method includes providing a non-polar (10-10) m-plane gallium and nitrogen containing substrate member having an off-cut to provide an off-axis oriented crystalline surface plane in a specific embodiment. In an example, the off-cut or off-set can be up to about +/−20 degrees toward a c-plane and/or +/−10 degrees toward an a-plane, such that the orientations may be considered an exposed semi-polar plane. Examples of such semipolar planes would (30-31), (30-3-1), (20-21), (20-2-1), (30-32), and (30-3-2), among others. In a specific embodiment, the present method includes forming a gallium and nitrogen containing epitaxial layer using an epitaxial process with greater than atmospheric pressure of 800-1600 Torr to form at least a quantum well having a thickness of at least 1.5, 3.5, or 5.0 nanometers and greater. Preferably, the gallium nitride epitaxial layer has a surface region substantially smooth and free from hillocks.

As used herein, the term "miscut" should be interpreted according to ordinary meaning understood by one of ordinary skill in the art and does not imply a specific process to achieve the orientation. The term miscut is not intended to imply any undesirable cut relative to, for example, any of the crystal planes, e.g., c-plane, a-plane. The term miscut is intended to describe a surface orientation slightly tilted with respect to the primary surface crystal plane such as the nonpolar (10-10) GaN plane, however, does not need to physically originate from the primary surface crystal plane, which is merely a reference point. Additionally, the term "offcut" or "off-axis" is intended to have a similar meaning as miscut that does not imply any process to achieve the orientation, although there could be other variations, modifications, and alternatives. In yet other embodiments, the crystalline surface plane is not miscut and/or offcut and/or off-axis but can be configured using a mechanical and/or chemical and/or physical process to expose any one of the crystalline surfaces described explicitly and/or implicitly herein. In specific embodiments, the terms miscut and/or offcut and/or off-axis are characterized by at least one or more directions and corresponding magnitudes, although there can be other variations, modifications, and alternatives.

Benefits are achieved over pre-existing techniques using the present invention. In particular, the present invention enables a cost-effective technique for growth of large area crystals of non-polar materials, including GaN, AN, InN, InGaN, and AlInGaN and others. In a specific embodiment, the present method and resulting structure are relatively simple and cost effective to manufacture for commercial applications. A specific embodiment also takes advantage of a combination of techniques, which solve a long standing need. In a preferred embodiment, the (10-10) non-polar substrate and overlying epitaxial crystalline gallium nitride containing film are smooth and substantially free from hillocks and the like, which improve device performance. As used herein, the term "smooth" generally means substantially free from hillocks or other surface imperfections, which lead to degradation in device performance, including reliability, intensity, efficiency, and other parameters that generally define performance. Of course, the term smooth would also include other interpretations known by one of ordinary skill in the art, as well as variations, modifications, and alternatives. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION

Figure 1A:
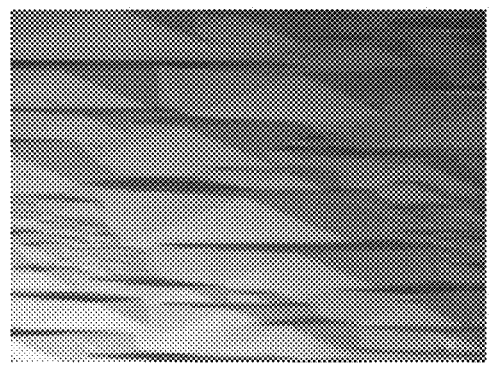
FIG. 1A is an optical micrograph image representative of a conventional surface region including hillock structures on a non-polar GaN substrate.

According to the present invention, techniques related generally to optical devices are provided. More particularly, the present invention provides a method and device for fabricating crystalline films for emitting electromagnetic radiation using non-polar (10-10) gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In one or more embodiments, the present invention is directed to generate high efficiency GaN-based light emitting devices operating at wavelengths beyond 400 nm for blue, green, yellow and red emission according to embodiments of the present invention. The proposed device will be used as an optical source for various commercial, industrial, or scientific applications. These structures are expected to find utility in existing applications where blue-violet, blue, green, yellow and red laser/LED emission is required. Existing applications include display systems based on blue and/or green laser diodes and violet laser diodes for HD-DVD and Sony Blu- Ray™ players. One particularly promising application for these devices is specialty lighting where blue laser diodes will pump phosphors to emit white light. Laser based television is also expected to emerge in coming year. Other potential application is for optical communication through polymer based fibers or underwater communication.

In a specific embodiment, the present invention provides a GaN-based semiconductor laser/LED growth/fabrication method to achieve increased wavelength operation into the blue, green, yellow and red regime on nonpolar GaN substrates where superior laser/LED performance can be expected according to a specific embodiment. The device relies on smooth surface region films of epitaxial crystalline GaN containing materials for improved device performance. The smooth surface region and therefore higher quality crystalline material can be derived from epitaxial growth techniques according to one or more embodiments.

Epitaxial growth on the nonpolar (10-10) plane of bulk GaN has been emerging and possesses various limitations. Understanding growth parameter space for optimal epitaxial layer deposition is often important for the realization of high performance electronic on optoelectronic devices fabricated from the epitaxial layers. At least one key aspect of the film quality is the morphology. Morphology manifests itself in large scale features that are on the order of tens to hundreds of microns all the way down to the atomic scale on the order of Angstroms. Achieving smooth epitaxial layers on both the large scale and small scale often translate into high performance devices.

In a specific embodiment, the present invention provides a method of fabricating an optical device. The method includes providing a non-polar (10-10) gallium nitride substrate member having an off-axis non-polar oriented crystalline surface plane, which is greater in magnitude than about negative 0.6 degrees and less than 20 degrees toward the c-plane (0001). The method includes forming a gallium nitride containing epitaxial layer having a surface region substantially free of hillocks overlying the slightly off-axis non-polar oriented crystalline surface plane and maintaining the gallium nitride containing epitaxial layer in an atmospheric environment during the formation of the gallium and nitrogen containing epitaxial layer.

In an alternative embodiment, the present invention provides an optical device. The optical device includes a gallium containing substrate member having an off-axis m-plane oriented crystalline surface plane. The off-axis m-plane oriented crystalline surface plane ranging from about 0 degrees to about +/−20 degrees toward a c-plane and a gallium nitride containing epitaxial layer formed overlying the off-axis oriented crystalline surface plane configured using at least a substantially atmospheric pressure epitaxial formation process to form at least a region of a quantum well of at least 1.5 nanometers and greater. The device includes a surface region overlying the gallium nitride epitaxial layer, the surface region being substantially free from hillocks.

In an alternative example, the present invention provides a method of fabricating a laser device configured to emit electromagnetic radiation ranging from 420 nm to 485 nm or 500 nm to 550 nm. The method includes providing a non-polar (10-10) gallium nitride substrate member having an off-axis non-polar oriented crystalline surface plane. The off-axis non-polar oriented crystalline surface plane is between negative 13 and negative 17 degrees from an m-plane toward a c-plane and the off-axis non-polar oriented crystalline surface plane being between 2 and 8 degrees from m-plane toward an a-plane. The method includes forming a gallium nitride containing epitaxial layer having a surface region substantially free of hillocks overlying the slightly off-axis non-polar oriented crystalline surface plane under an atmospheric environment ranging from 650 Torr to 850 Torr during the formation of the gallium and nitrogen containing epitaxial layer. The method also includes forming a ridge structure configured overlying the gallium nitride containing epitaxial layer such that the ridge structure is aligned in a projection of a c-direction.

In a specific example, the present invention provides a method of fabricating a laser device configured to emit electromagnetic radiation ranging from 420 nm to 485 nm or 500 nm to 550 nm. The method includes providing a non-polar (10-10) gallium and nitrogen containing substrate member having an off-axis non-polar oriented crystalline surface plane, which is greater in magnitude than about 0.6 degrees and less in magnitude than about 20 degrees from an m-plane toward a c-plane. The method includes forming a gallium and nitrogen containing epitaxial layer formed overlying the off-axis oriented crystalline surface plane configured using at least a substantially atmospheric pressure epitaxial formation process to form at least a region of a quantum well having a thickness of at least 1.5 nanometers and greater. The method includes forming a surface region overlying the gallium and nitrogen containing epitaxial layer. The method includes forming a gallium and nitrogen containing epitaxial layer having a surface region substantially free of hillocks overlying the off-axis non-polar oriented crystalline surface plane and forming at least a quantum well region under a super atmospheric pressure environment ranging from about 800 to about 1600 Torr. The quantum well region has a thickness of at least 1.5 nanometers and greater. The method includes forming a ridge structure configured overlying the gallium nitride containing epitaxial layer such that the ridge structure is aligned in a projection of a c-direction.

Figure 1B:
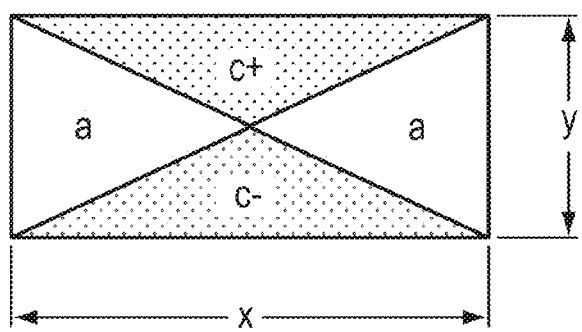
FIG. 1B is a schematic illustration of a top down view of a hillock structure.
Figure 1C:
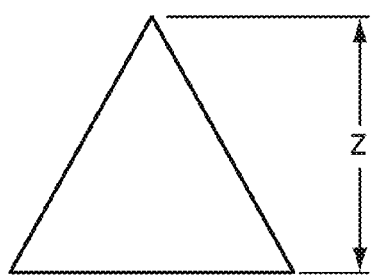
FIG. 1C is a schematic illustration of a cross-sectional view of a hillock structure.

FIG. 1A is an optical micrograph image which represents a conventional surface region of a non-polar (10-10) oriented gallium nitride epitaxial layer, including hillock structures. The surface shown is representative of epitaxial deposition at atmospheric pressure conditions (e.g., 700-800 Torr) on a non-polar (10-10) GaN substrate. As shown, non-polar GaN can exhibit very distinct large-scale features referred to herein as hillocks. FIG. 1B and FIG. 1C are schematic illustrations of a top-down and cross-sectional view of such a hillock feature. As shown, these hillocks are pyramidal in shape and typically elongated in the in the positive and negative a-directions and can demonstrate significantly steep sidewalls in the positive and negative c-directions. Lateral dimensions of such hillocks can range from 50-100 microns or greater. The hillocks can have a height scale on the orders of hundreds of nanometers, therefore they can be disruptive/detrimental to optoelectronic devices such as laser diodes since the cladding layers will have varying thickness along the cavity and the gain layers between the cladding layers can have sharp interfaces. As shown, the large-scale morphological features are predominantly "pyramidal hillocks" or like structures. These characteristics can lead to increased loss in optical devices such as lasers, reduced gain, and perhaps reduced yield and reliability.

A method according to one or more embodiments for forming a smooth epitaxial film using an offcut or miscut or off-axis substrate is briefly outlined below.
1. Provide GaN substrate or boule;
2. Perform off-axis miscut of GaN substrate on nonpolar crystalline planes to expose desired surface region or process substrate or boule (e.g., mechanical process) to expose off-axis oriented surface region from the nonpolar (10-10) m-plane;.

3. Transfer GaN substrate into MOCVD process chamber;
4. Provide a carrier gas selected from nitrogen gas, hydrogen gas, or a mixture of them;
5. Provide a nitrogen bearing species such as ammonia or the like;
4. Raise MOCVD process chamber to growth temperature, e.g., 700 to 1200 Degrees Celsius and configured at atmospheric pressure, above atmospheric pressure, or reduced pressure;
5. Maintain the growth temperature within a predetermined range;
6. Combine the carrier gas and nitrogen bearing species such as ammonia with group III precursors such as the indium precursor species tri-methyl-indium and/or tri-ethyl-indium, the gallium precursor species tri-methyl-gallium and/or tri-ethyl-gallium, and/or the aluminum precursor tri-methyl-aluminum into the chamber;
7. Form an epitaxial film containing one or more of the following layers GaN, InGaN, AlGaN, InAlGaN;
8. Cause formation of a surface region of the epitaxial gallium nitride film substantially free from hillocks and other surface roughness structures and/or features;
9. Repeat steps (7) and (8) for other epitaxial films to form one or more device structures; and
10. Perform other steps, desired.

The above sequence of steps provides a method according to an embodiment of the present invention. In a specific embodiment, the present invention provides a method and resulting crystalline epitaxial material with a surface region that is substantially smooth and free from hillocks and the like for improved device performance. Although the above has been described in terms of an off-axis surface configuration, there can be other embodiments having an on-axis configuration using one or more selected process recipes, which have been described in more detail throughout the present specification and more particularly below. Other alternatives can also be provided where steps are added, one or more steps are removed, or one or more steps are provided in a different sequence without departing from the scope of the claims herein.

As merely an example, the present method can use the following sequence of steps in forming one or more of the epitaxial growth regions using an MOCVD tool operable at atmospheric pressure or low pressure in some embodiments.
1. Start;
2. Provide a crystalline substrate member comprising a backside region and a surface region, which has been offcut or miscut or off-axis;
3. Load substrate member into an MOCVD chamber;
4. Place substrate member on susceptor, which is provided in the chamber, to expose the offcut or miscut or off axis surface region of the substrate member;
5. Subject the surface region to a first flow (e.g., derived from one or more precursor gases including at least an ammonia containing species, a Group III species, and a first carrier gas) in a first direction substantially parallel to the surface region;
6. Form a first boundary layer within a vicinity of the surface region;
7. Provide a second flow (e.g., derived from at least a second carrier gas) in a second direction configured to cause change in the first boundary layer to a second boundary layer;
8. Increase a growth rate of crystalline material formed overlying the surface region of the crystalline substrate member;
9. Continue crystalline material growth to be substantially free from hillocks and/or other imperfections;
10. Cease flow of precursor gases to stop crystalline growth;
11. Perform other steps and repetition of the above, as desired;
12. Stop.

The above sequence of steps provides methods according to an embodiment of the present invention. As shown, the method uses a combination of steps including a way of forming a film of crystalline material using MOCVD. In preferred embodiments, the present invention includes a multiflow technique provided at atmospheric pressure (e.g., 700-800 Torr) for formation of high quality gallium nitride containing crystalline films that are substantially free from hillocks and other imperfections that lead to crystal degradation. Many other methods, devices, and systems are also included. Of course, other alternatives can also be provided where steps are added, one or more steps are removed, or one or more steps are provided in a different sequence without departing from the scope of the claims herein. Additionally, the various methods can be implemented using a computer code or codes in software, firmware, hardware, or any combination of these. In other embodiments, the present MOCVD tool can be modified, updated, varied, or combined with other hardware, processing, and software. Further details of the present method can be found throughout the present specification and more particularly below in reference to the figures.

Figure 2:
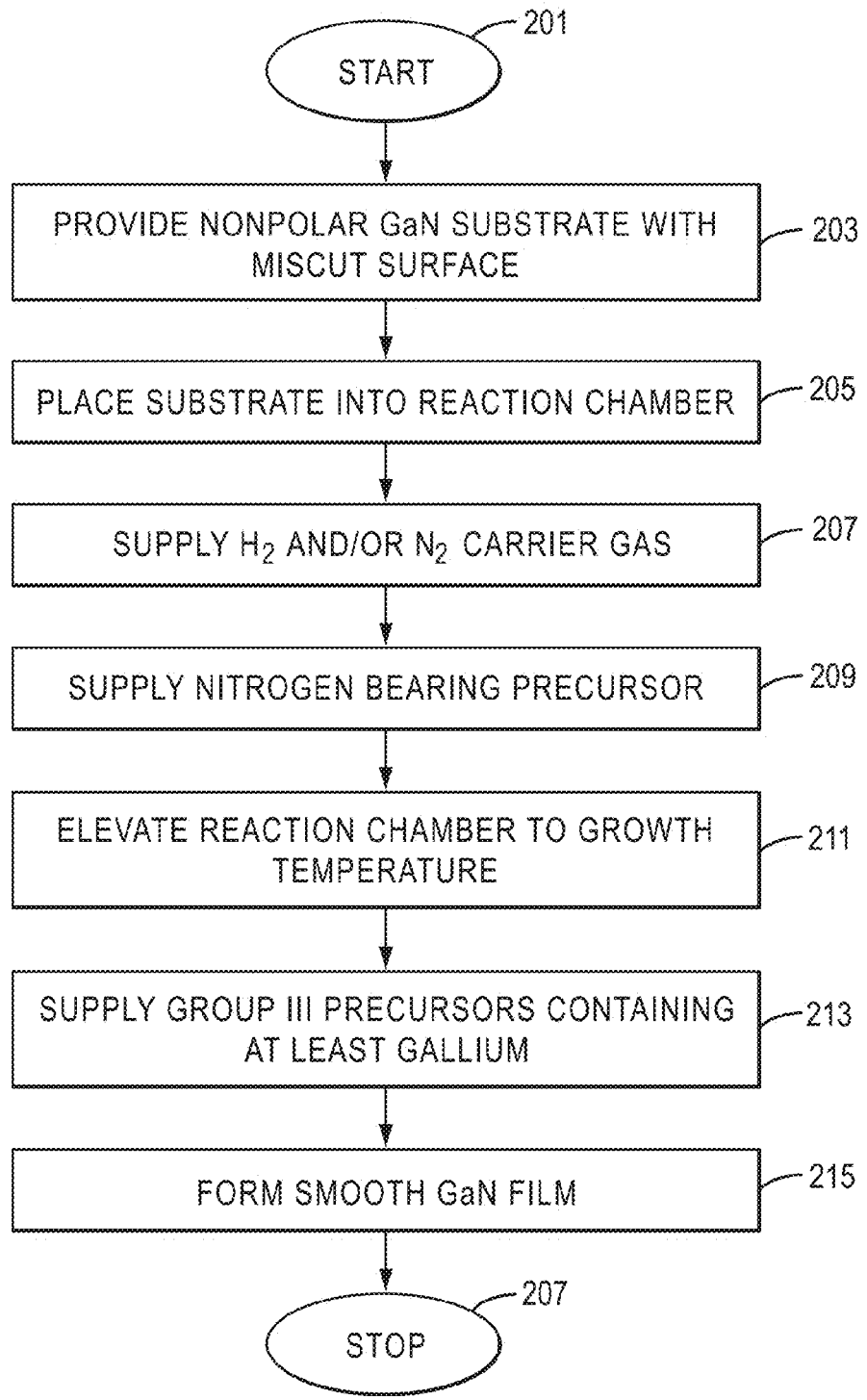
FIG. 2 is a simplified flow diagram of a method for fabricating an improved GaN film according to an embodiment of the present invention.

FIG. 2 is a simplified flow diagram of a method for fabricating an improved GaN film according to an embodiment of the present invention. In a specific embodiment, the present method uses a technique using MOCVD as described in, for example, U.S. application Ser. No. 12/573,820 filed on Oct. 5, 2009, which is incorporated by reference herein.

As shown, the present method begins with start, step 201. In a specific embodiment, the present method uses a MOCVD reactor configured to carry out the present method. Details of the reactor are provided more particularly in U.S. application Ser. No. 12/573,820 filed on Oct. 5, 2009, which is incorporated by reference herein.

In a specific embodiment, the present invention provides (step 203) a crystalline substrate member comprising a backside region and a surface region. In a specific embodiment, the crystalline substrate member can include, among others, a gallium nitride wafer, or the like. More preferably, the substrate is an offcut of the nonpolar (10-10) m-plane GaN substrate, but can be others. In an example, the off-cut or off-set can be up to about +/−21 degrees toward a c-plane and/or +/−10 degrees toward an a-plane, such that the orientations may be considered an exposed semi-polar plane. Examples of such semipolar planes would (30-31), (30-3-1), (20-21), (20-2-1), (30-32), and (30-3-2), among others.

In a specific embodiment, the present method uses a miscut or offcut crystalline substrate member or boule of GaN, but can be other materials and does not imply use of a process of achieving the miscut or offcut. As used herein, the term "miscut" should be interpreted according to ordinary meaning as understood by one of ordinary skill in the art. The term miscut is not intended to imply any undesirable cut relative to, for example, any of the crystal planes, e.g., c-plane, a-plane. The term miscut is intended to describe a surface orientation slightly tilted with respect to the primary surface crystal plane such as the nonpolar (10-10) GaN plane. As used herein, the term "slightly" can include an offcut toward the c-plane at values of up to about +/−21 degrees toward a c-plane and/or +/−10 degrees toward an a-plane, such that the orientations may be considered semipolar. Examples of such semipolar planes include (30-31), (30-3-1), (20-21), (20-2-1), (30-32), and (30-3-2), among others. Additionally, the term "offcut" is intended to have a similar meaning as miscut, although there could be other variations, modifications, and alternatives. In yet other embodiments, the crystalline surface plane is not miscut and/or offcut but can be configured using a mechanical and/or chemical and/or physical process to expose any one of the crystalline surfaces described explicitly and/or implicitly herein. In specific embodiments, the term miscut and/or offcut and/or off axis is characterized by at least one or more directions and corresponding magnitudes, although there can be other variations, modifications, and alternatives.

As shown, the method includes placing or loading (step 205) the substrate member into an MOCVD chamber. In a specific embodiment, the method supplies one or more carrier gases, step 207, and one or more nitrogen-bearing precursor gases, step 209, which are described in more detail below. In one or more embodiments, the crystalline substrate member is provided on a susceptor from the backside to expose the surface region of the substrate member. The susceptor is preferably heated using resistive elements or other suitable techniques. In a specific embodiment, the susceptor is heated (step 211) to a growth temperature ranging from about 700 to about 1200 Degrees Celsius, but can be others.

In a specific embodiment, the present method includes subjecting the surface region of the crystalline substrate to a first flow in a first direction substantially parallel to the surface region. In a specific embodiment, the method forms a first boundary layer within a vicinity of the surface region. In a specific embodiment, the first boundary layer is believed to have a thickness ranging from about 1 millimeters to about 1 centimeters, but can be others. Further details of the present method can be found below.

Depending upon the embodiment, the first flow is preferably derived from one or more precursor gases including at least an ammonia containing species, a Group III species (step 213), and a first carrier gas, and possibly other entities. Ammonia is a Group V precursor according to a specific embodiment. Other Group V precursors include $N_2$. In a specific embodiment, the first carrier gas can include hydrogen gas, nitrogen gas, argon gas, or other inert species, including combinations. In a specific embodiment, the Group III precursors include TMGa, TEGa, TMIn, TMAl, dopants (e.g., $Cp_2Mg$, disilane, silane, diethelyl zinc, iron, manganese, or cobalt containing precursors), and other species. As merely an example, a preferred combination of miscut/offcut/substrate surface configurations, precursors, and carrier gases are provided below.

Off-cut non-polar (10-10) GaN substrate surface configured less than+/1 20 degrees in magnitude toward c-plane (0001);
Carrier Gas: Any mixture of $N_2$ and $H_2$, but preferably all $H_2$;
Group V Precursor: $NH_3$; Group III Precursor: TMGa and/or TEGa and/or TMIn and/or TEIn and/or TMAl; and
Optional Dopant Precursor: Disilane, silane, $Cp_2Mg$;
or
Off-cut non-polar (10-10) GaN substrate surface configured less than+/1 20 degrees in magnitude toward c-plane (0001);
Carrier Gas: Any mixture of $N_2$ and $H_2$, but preferably all $N_2$;
Group V Precursor: $NH_3$; Group III Precursor: TMGa and/or TEGa and/or TMIn and/or TEIn and/or TMAl; and
Optional Dopant Precursor: Disilane, silane, $Cp_2Mg$;

In a specific embodiment, the present method also includes a step of providing a second flow (e.g., derived from at least a second carrier gas) in a second direction configured to cause change in the first boundary layer to a second boundary layer. In a specific embodiment, the second direction is normal to the first direction, but can be slightly varied according to other embodiments. Additionally, the second boundary layer facilitates improved crystalline growth as compared to formation using the first boundary layer embodiment. In a specific embodiment, the second flow increases a growth rate of crystalline material formed overlying the surface region of the crystalline substrate member. [0062] Depending upon the embodiment, the method also continues (step 215) with epitaxial crystalline material growth, which is substantially smooth and free of hillocks or other imperfections. In a specific embodiment, the method also can cease flow of precursor gases to stop growth and/or perform other steps. In a specific embodiment, the method stops at step 217. In a preferred embodiment, the present method causes formation of a gallium nitride containing crystalline material that has a surface region that is substantially free of hillocks and other defects, which lead to poorer crystal quality and can be detrimental to device performance. In a specific embodiment, at least 90% of the surface area of the crystalline material is free from pyramidal hillock structures.

The above sequence of steps provides methods according to an embodiment of the present invention. As shown, the method uses a combination of steps including a way of forming a film of crystalline material using MOCVD. In preferred embodiments, the present invention includes a multi-flow technique provided at atmospheric pressure for formation of high quality gallium nitride containing crystalline films, which have surface regions substantially smooth and free from hillocks and other defects or imperfections. Other alternatives can also be provided where steps are added, one or more steps are removed, or one or more steps are provided in a different sequence without departing from the scope of the claims herein. Additionally, the various methods can be implemented using a computer code or codes in software, firmware, hardware, or any combination of these. In other embodiments, the present MOCVD tool can be modified, updated, varied, or combined with other hardware, processing, and software.

The above sequence of steps provides a method according to an embodiment of the present invention. In a specific embodiment, the present invention provides a method and resulting crystalline material that is substantially free from hillocks and the like for improved device performance. Other alternatives can also be provided where steps are added, one or more steps are removed, or one or more steps are provided in a different sequence without departing from the scope of the claims herein.

Figure 3:
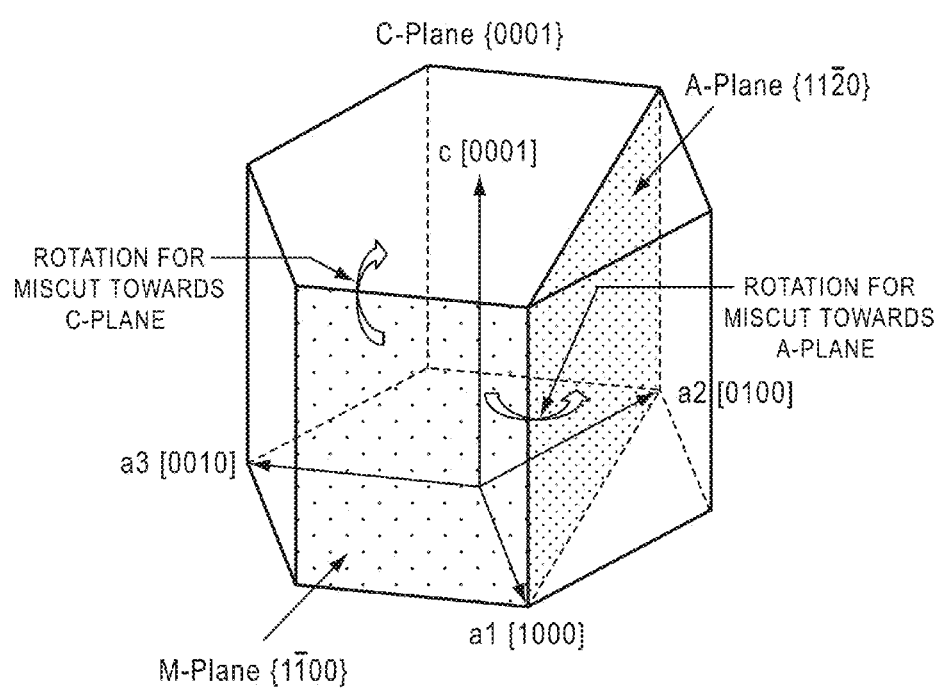
FIG. 3 is a simplified diagram illustrating various miscuts/offcuts in +/− c/a planes according to one or more embodiments of the present invention.

FIG. 3 is a simplified diagram illustrating a wurtzite unit cell structure including various miscuts/offcuts in +/− c/a planes according to one or more embodiments of the present invention. This diagram is merely an example, which should not unduly limit the claims herein. One of ordinary skill in the art would recognize other variations, modifications, and alternatives. As shown, the wurtzite unit cell comprises gallium nitride material, and illustrates relative orientations of the non-polar m-plane and non-polar a-plane. Additionally, the c-plane is also illustrated for reference purposes. In a specific embodiment, the curved arrows illustrate tilt directions for miscut or offcut orientations from an m-plane toward the c-plane and/or a-plane.

Figure 4A:
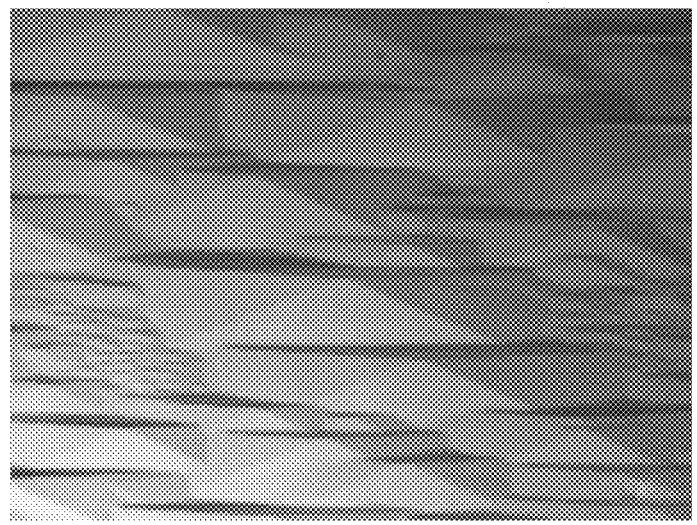
FIG. 4 through FIG. 6 show photographs illustrating the improved GaN film according to an embodiment of the present invention.
Figure 4B:
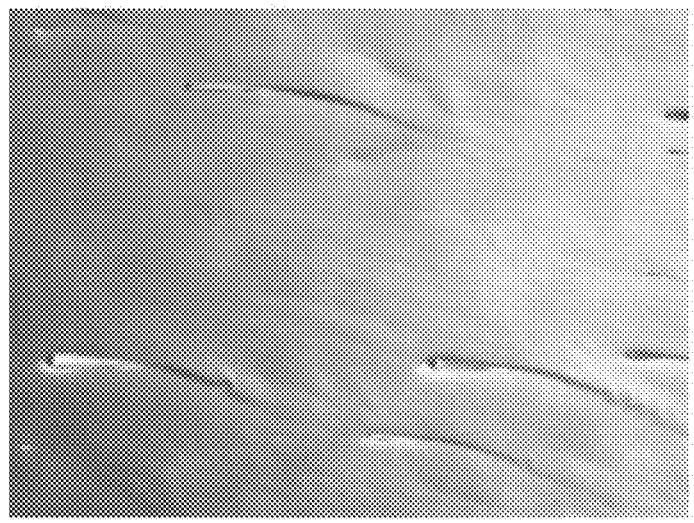
Figure 5:
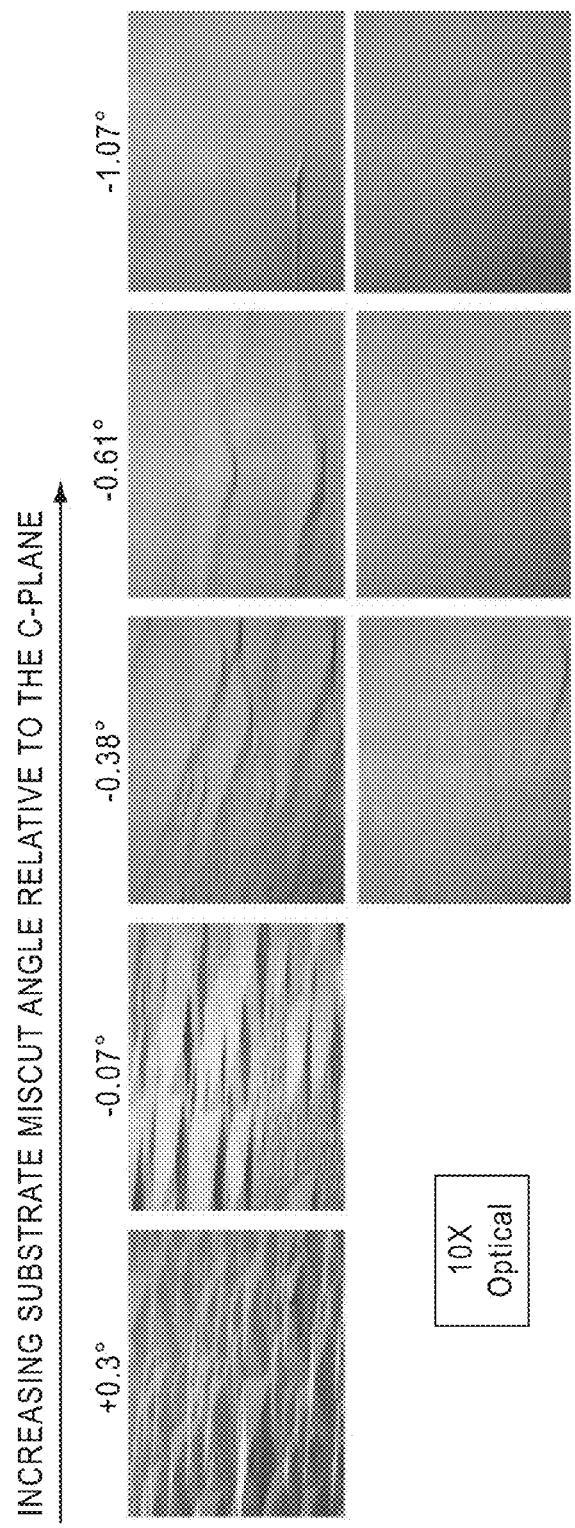
Figure 6A:
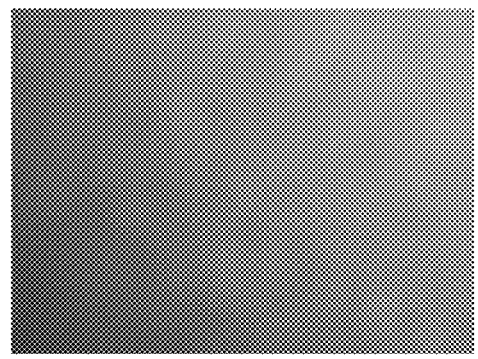
Figure 6B:
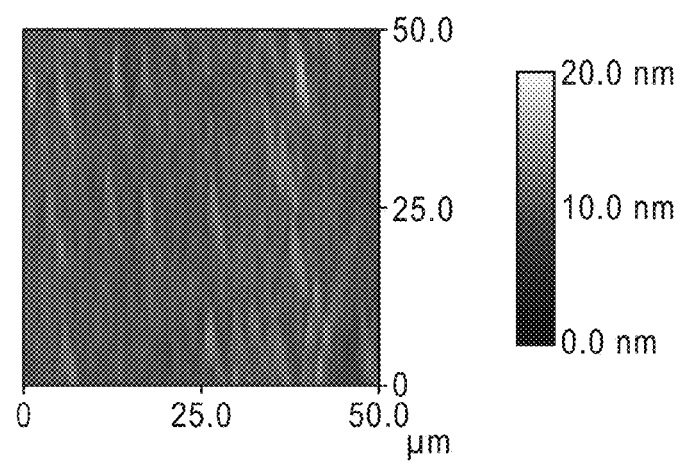
Figure 6C:
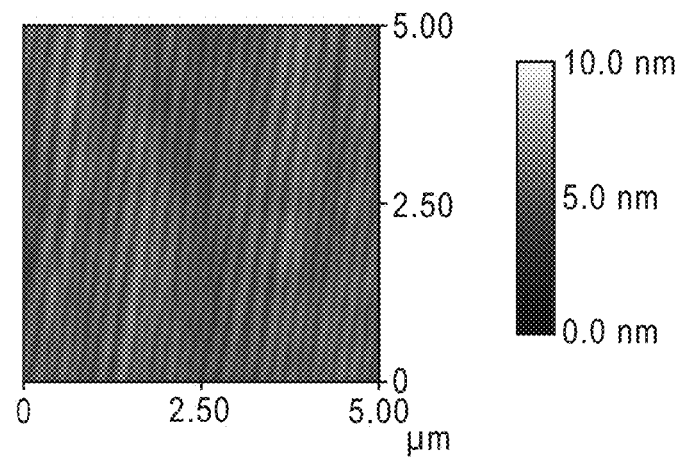

To prove the operation and method of the present invention, we performed various experiments. These experiments are merely examples, which should not unduly limit the scope of the claims herein. As an example, FIG. 4A and FIG. 4B present optical micrograph images of the resulting surface morphology in epitaxial films grown with the use of $H_2$ carrier gas on (a) an on-axis nonpolar (10-10) GaN substrate and (b) on a nonpolar (10-10) GaN substrate with a substantial miscut toward the a-plane. FIG. 5 presents images of the resulting surface morphology in epitaxial films grown with the use of $H_2$ carrier gas on nonpolar (10-10) GaN substrates with a varying degree of miscut toward the c-plane. FIG. 6A, FIG. 6B, and FIG. 6C presents images of the resulting surface morphology in epitaxial films grown on a nominally on-axis nonpolar (10-10) GaN substrate with the use of $N_2$ carrier gas. Further details of our experiments are shown below.

In this example, we understood that the hillocking can be controlled with choice of carrier gases ($N_2$ or $H_2$) or a mixture thereof and/or with the choice of slightly off-axis (e.g., miscut or offcut or formation (e.g., grinding, polishing etching, or other shaping processes) nonpolar (10-10) crystal planes. In particular, the hillocking begins to disappear when the substrate is miscut slightly toward the positive or negative a-plane. See, for example, FIG. 4A and FIG. 4B. For miscuts greater in magnitude than +/−0.3 degrees toward the a-plane, the epitaxial layers became smooth using a carrier gas of $H_2$, which has been known. Unexpectedly, we have discovered a marked double peak in the 400-440 nm emission spectra (as measured by photoluminescence and electroluminescence) when the a-plane miscut reaches the required amount to achieve smooth morphology. This could be a useful phenomenon in other devices, but is not desirable for laser fabrication in the 400-440 nm wavelength range. It is possible that larger miscuts would eliminate the double peaked spectra and would offer some other benefit. For example, the double peak is not observed when the composition of the light emitting layer(s) is adjusted for emission in the 480 nm range. These and other limitations have been overcome using the methods and resulting structures claimed and described herein.

In an effort to achieve smooth epitaxial layers with no double peak with an emission spectra around 405 nm, positive and negative miscuts toward the c-plane (0001) were explored using growth techniques with $H_2$ as the carrier gas. See, for example, FIG. 5. It was found that when small positive miscut angles toward the plane c-plane (0001) were used, hillocking was not suppressed and may actually have become more severe. However, when using negative miscut angles toward the c-plane (0001), the hillocking began to disappear when the miscut angle was greater in magnitude than about negative 0.3-0.5 degrees, and would be substantially free from hillocks when the angle was greater in magnitude than about negative 0.6 degrees. In some examples, it was discovered to high quality epitaxial growth could not be achieved using small positive offcuts. There was no double peak observed in the photoluminescence or electroluminescence spectra demonstrating a promising approach to achieving smooth epitaxial layers along with high quality light emitting layers for use in optical devices such as laser diodes and light emitting diodes.

In addition to substrate miscut, choice of MOCVD carrier gas was also explored. It was found that when all $H_2$ is replaced by $N_2$ in the carrier gas, smooth relatively defect free epitaxy could be achieved on nonpolar substrates with nominally non-miscut (0.0+/−0.1 deg) toward the a-plane and c-plane. See, for example, FIG. 6A, FIG. 6B, and FIG. 6C. It is relatively uncommon to use all $N_2$ as the carrier gas when growing p-type GaN due to reduced dopant incorporation in the lattice, which increases resistance of the material and degrades device properties. To date, we have fabricated laser devices demonstrating high performance using all $N_2$ as the carrier gas in the n-cladding, active region, p-cladding, and even p-contact layer. The device did not demonstrate forward voltages higher than those grown using all $H_2$ as the carrier gases. Additionally, we believe that by using the appropriate mixture of $H_2$ and $N_2$ in the carrier gas along with the appropriate negative miscut toward the c-plane, smooth epitaxial layers can be achieved that will exhibit p-type GaN electrical properties equal to those grown in all $H_2$. Further examples of film growth and quality in reference to selected miscuts or offcuts are described throughout the present specification and more particularly below.

Figure 7A:
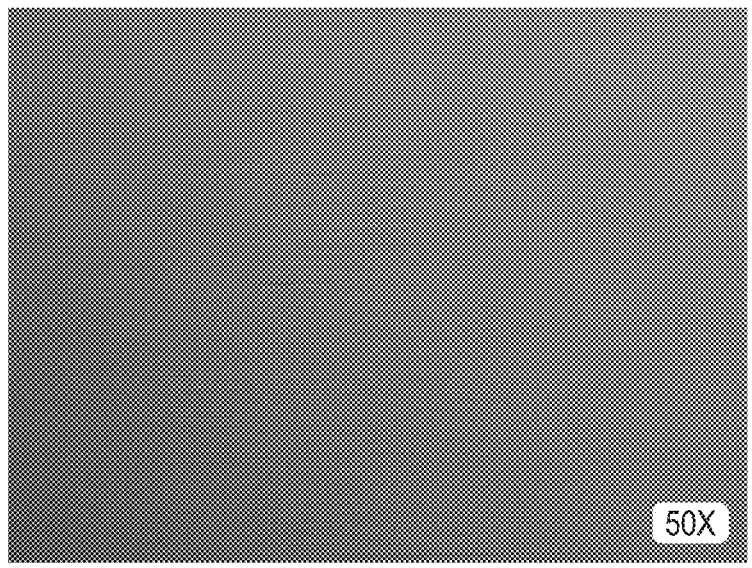
FIG. 7A and FIG. 7B show an effect of large negative miscut of about 5 degrees toward (0001) according to an example of the present invention.
Figure 7B:
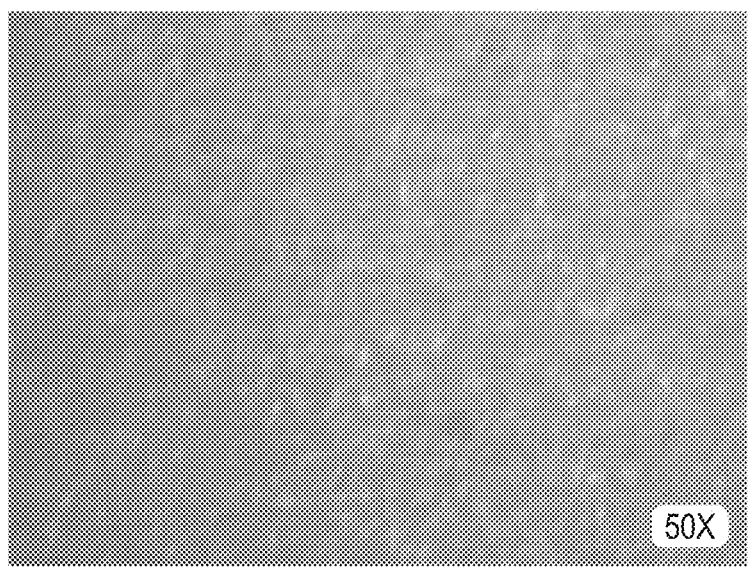

FIG. 7A and FIG. 7B show an effect of large negative miscut of about 5 degrees toward (0001) according to an example of the present invention. The optical micrographs show two examples of smooth, hillock-free surface morphology using $H_2$ carrier gas for growth of n-type cladding layers on GaN substrates with a negative about 5 degree offcut from m-plane toward c-plane. In this example, the surface is characterized by the semipolar orientation (60-6-1).

Figure 8A:
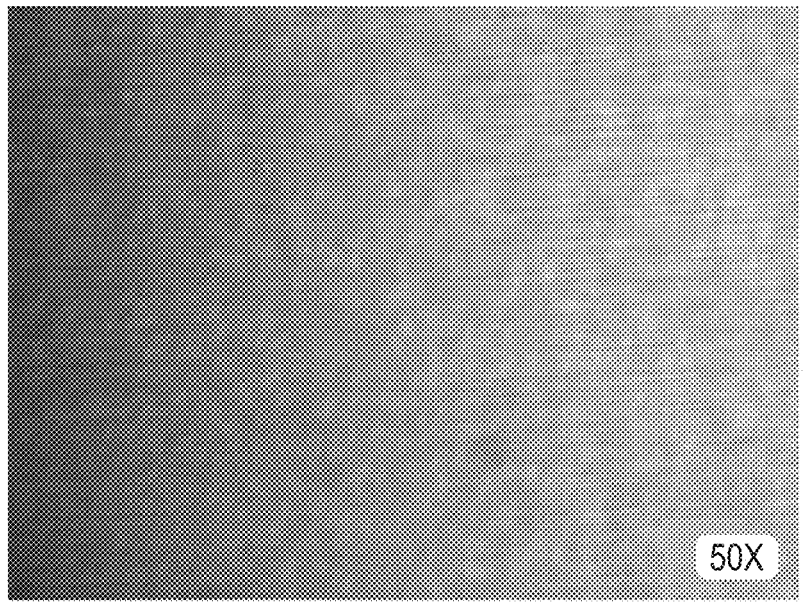
FIG. 8A and FIG. 8B show an effect of large negative miscut of ~7 degrees toward (0001) according to an example of the present invention.
Figure 8B:
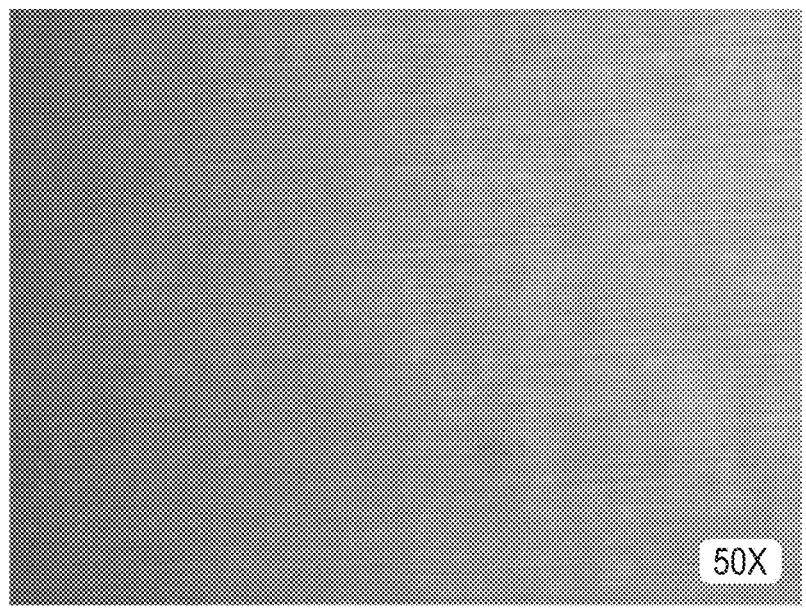

FIG. 8A and FIG. 8B show an effect of large negative miscut of about 7 degrees toward (0001) according to an example of the present invention. The optical micrographs show two examples of smooth, hillock-free surface morphology using $H_2$ carrier gas for growth of n-type cladding layers on substrates with a negative about 7 degree offcut from m-plane toward c-plane. In this example, the surface is characterized by the semipolar orientation (40-4-1).

Figure 9A:
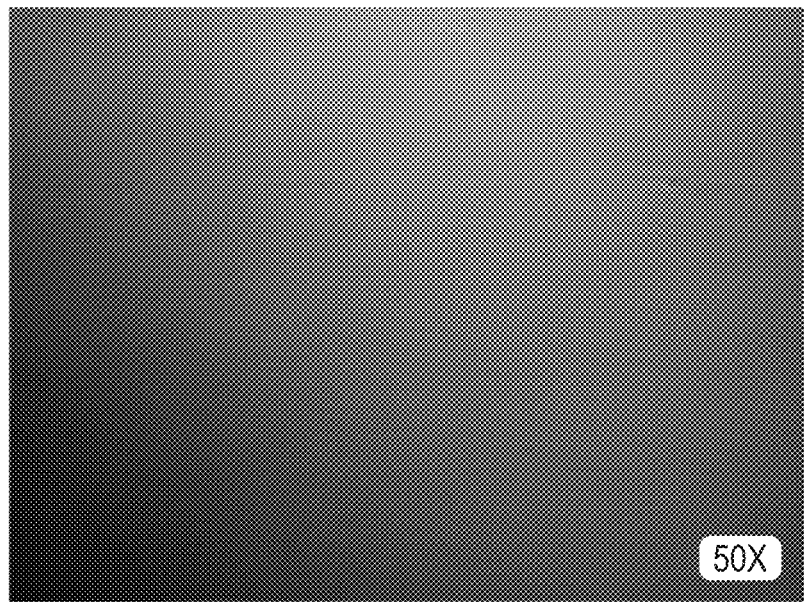
FIG. 9A and FIG. 9B show an effect of large negative miscut of about 10 degrees toward (0001) according to an example of the present invention.
Figure 9B:
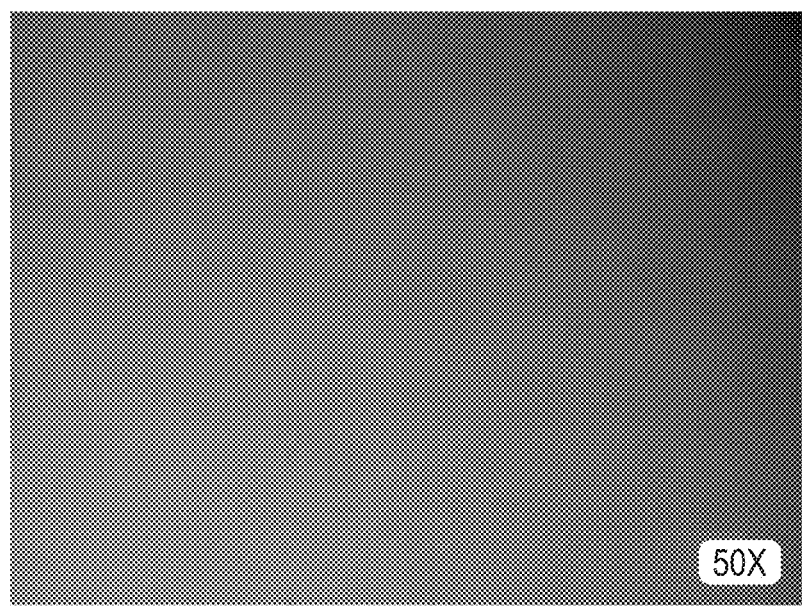

FIG. 9A and FIG. 9B show an effect of large negative miscut of about 10 degrees toward (0001) according to an example of the present invention. The optical micrographs show two examples of smooth, hillock-free surface morphology for (a) growth of n-type cladding layer using $H_2$ carrier gas and (b) growth of n-type cladding layer using $N_2$ carrier gas on substrates with a negative ~10 degree offcut from m-plane toward c-plane. In this example, this surface is characterized by the semipolar orientation (30-3-1).

Figure 10A:
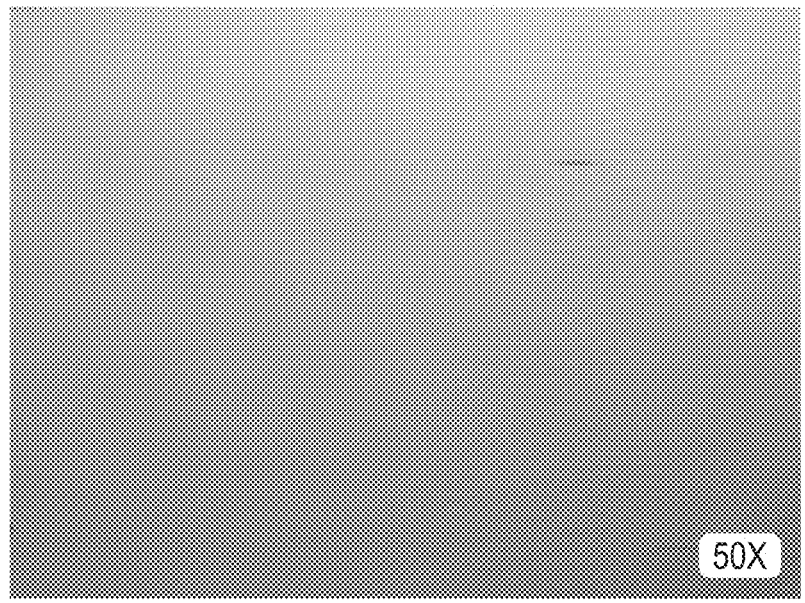
FIG. 10A and FIG. 10B show an effect of large negative miscut of about 15 degrees toward (0001) according to an example of the present invention.
Figure 10B:
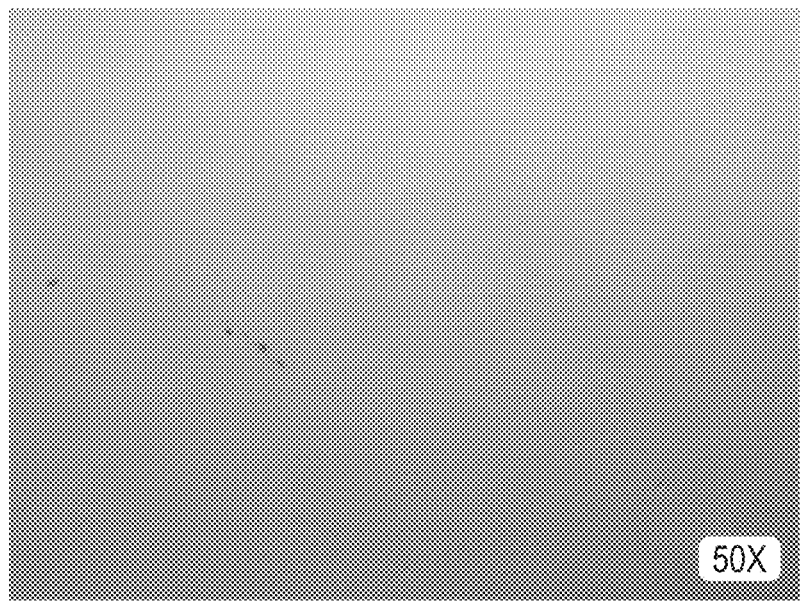

FIG. 10A and FIG. 10B show an effect of large negative miscut of about 15 degrees toward (0001) according to an example of the present invention. The optical micrographs show two examples of smooth, hillock-free surface morphology using $H_2$ carrier gas for growth of the n-type cladding layers on substrates with a negative 15 degree offcut from m-plane toward c-plane. In this example, the surface is characterized by the semipolar orientation (20-2-1).

Figure 11A:
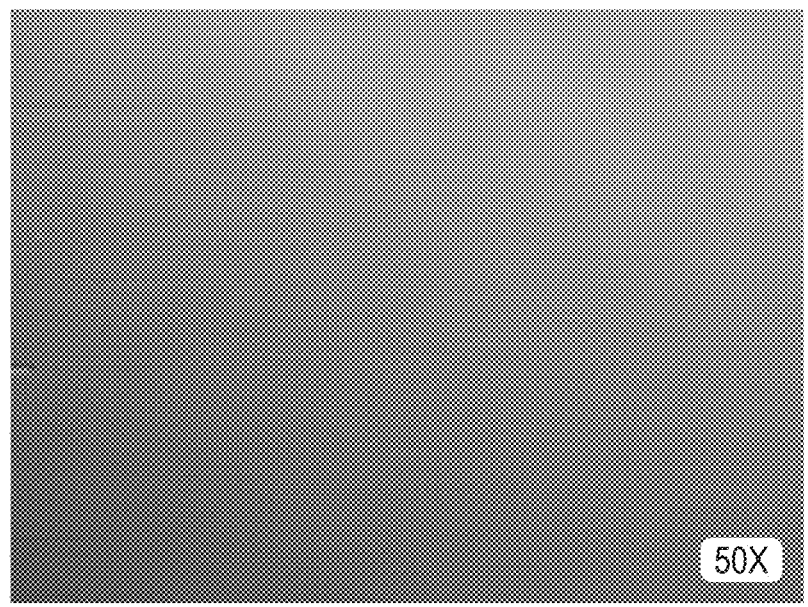
FIG. 11A and FIG. 11B show an effect of large positive miscut of about 10 degrees toward (0001) according to an example of the present invention.
Figure 11B:
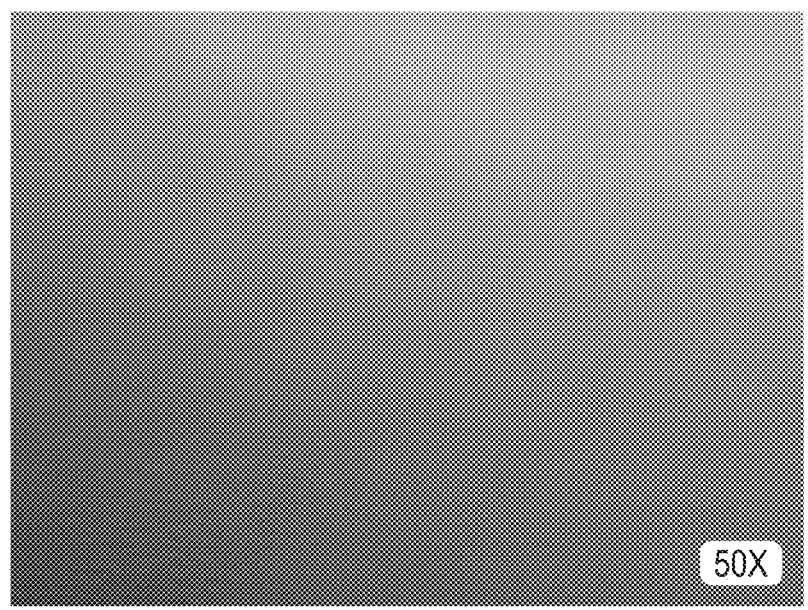

FIG. 11A and FIG. 11B show an effect of large positive miscut of about 10 degrees toward (0001) according to an example of the present invention. The optical micrographs show two examples of smooth, hillock-free surface morphology using $H_2$ carrier gas for growth of n-type cladding layers on substrates with a positive about 10 degree offcut from m-plane toward c-plane. In this example, the surface is characterized by the semipolar orientation (30-31).

Figure 12A:
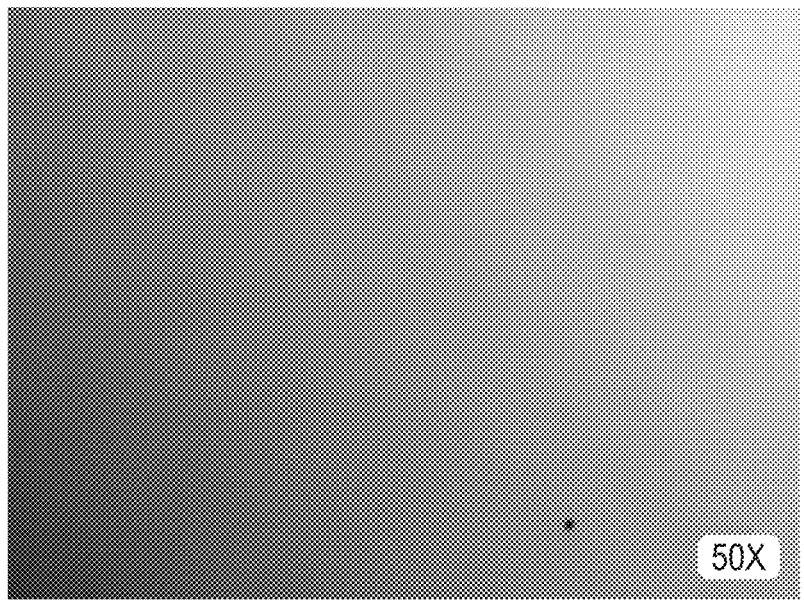
FIG. 12A and FIG. 12B show an effect of large positive miscut of about 15 degrees toward (0001) according to an example of the present invention.
Figure 12B:
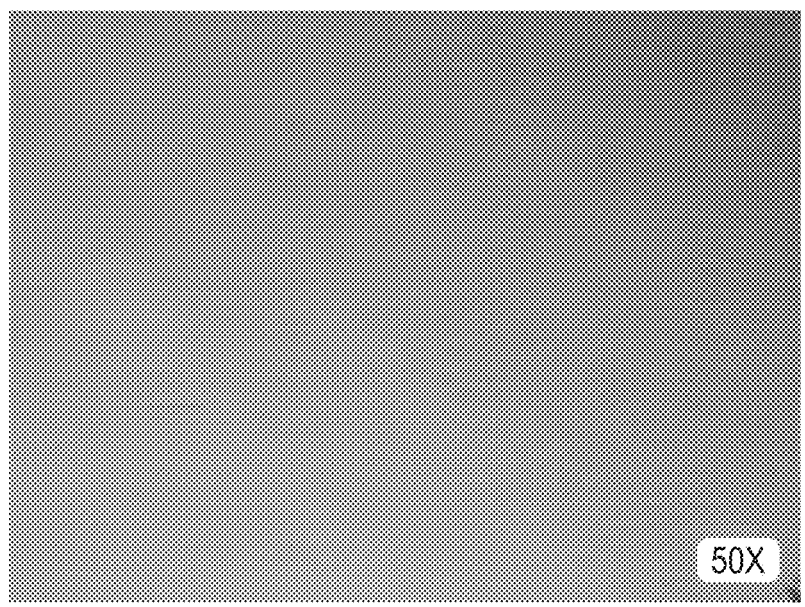

FIG. 12A and FIG. 12B show an effect of large positive miscut of about 15 degrees toward (0001) according to an example of the present invention. The optical micrographs show four examples of smooth, hillock-free surface morphology using $H_2$ carrier gas for growth of n-type cladding layers on substrates with a positive about 15 degree offcut from m-plane toward c-plane. In this example, the surface is characterized by the semipolar orientation (20-21).

Figure 13:
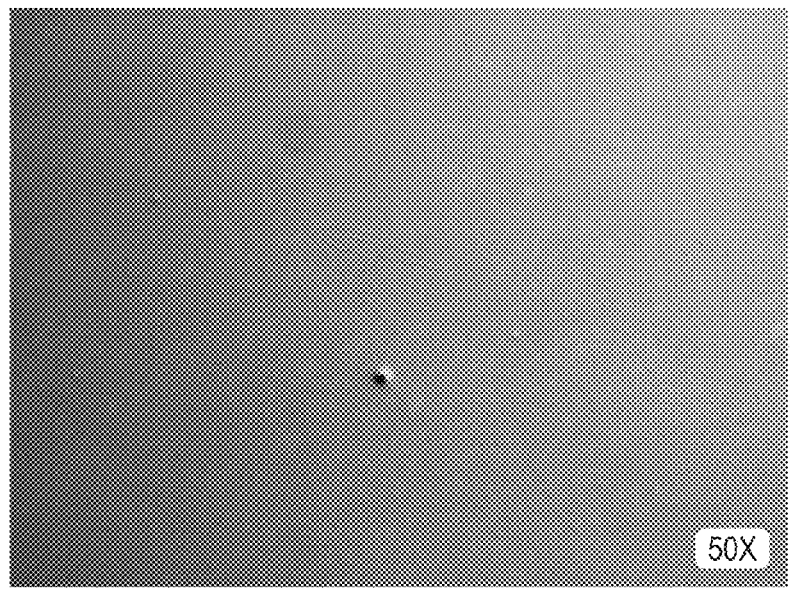
FIG. 13 shows an effect of large positive miscut of about 20 degrees toward (0001) according to an example of the present invention.

FIG. 13 shows an effect of large positive miscut of about 20 degrees toward (0001) according to an example of the present invention. Optical micrographs showing example of smooth, hillock-free surface morphology using $H_2$ carrier gas for growth of n-type cladding layers on substrate with a positive about 20 degree offcut from m-plane toward c-plane. In this example, the surface is characterized by the semipolar orientation (30-32).

Figure 14A:
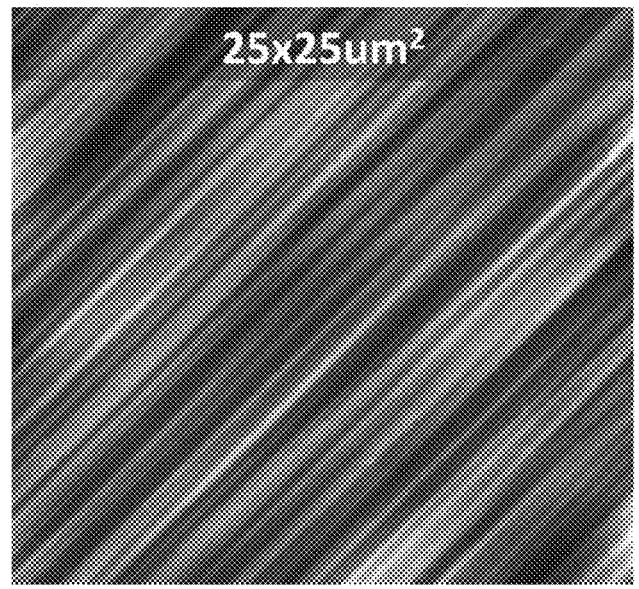
FIG. 14A and FIG. 14B shows AFM surface morphology of growth for $H_2$ and $N_2$ carrier gas on (20-21) according to an example of the present invention.
Figure 14B:

FIG. 14A and FIG. 14B show atomic force microscopy (AFM) surface morphology of growth for $H_2$ and $N_2$ carrier gas on (20-21) according to an example of the present invention. As shown are 25 μm×25 μm atomic force microscope images of n-type cladding growth on (20-21) using an (a) all $H_2$ type carrier gas showing an RMS roughness of 0.49 nm and using (b) all $N_2$ type carrier gas with an RMS roughness of 0.10 nm. The substantially reduced roughness associated with $N_2$ carrier gas may be desirable for optical device performance.

Figure 15A:
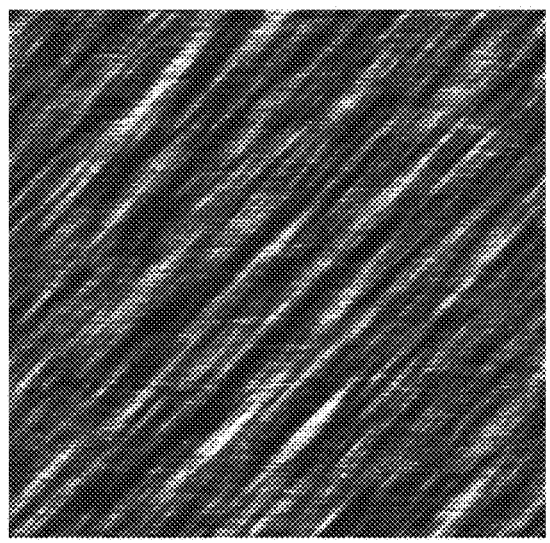
FIG. 15A and FIG. 15B shows AFM surface morphology for growth with $N_2$ carrier gas on (20-21) according to an example of the present invention.
Figure 15B:
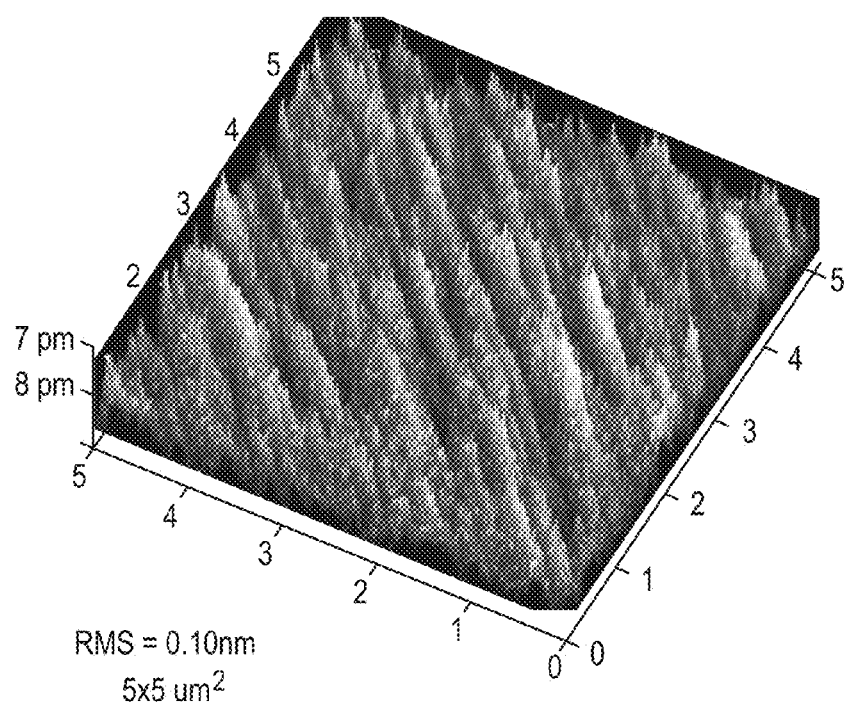

FIG. 15A and FIG. 15B show AFM surface morphology for growth with $N_2$ carrier gas on (20-21) according to an example of the present invention. As shown, the visuals include 5 μm×5 μm atomic force microscope images of n-type cladding growth on (20-21) using an all $N_2$ type carrier gas with an RMS roughness of 0.10 nm. The substantially reduced roughness associated with $N_2$ carrier gas may be desirable for optical device performance.

Figure 16A:
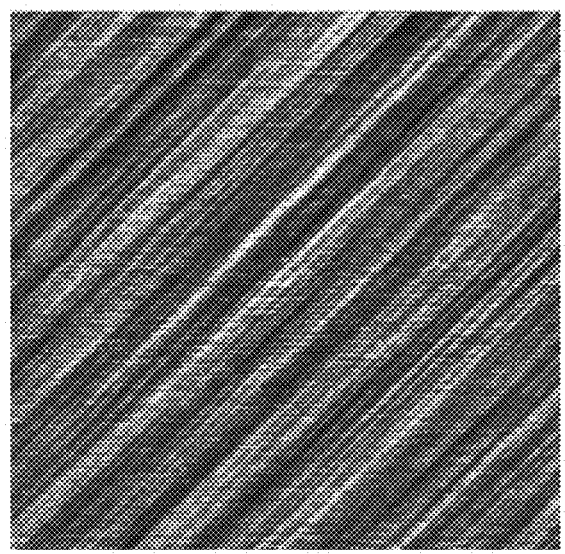
FIG. 16A and FIG. 16B shows AFM surface morphology for multilayer growth using a first $N_2$ carrier gas and a second H2 carrier gas on (20-21) according to an example of the present invention.
Figure 16B:
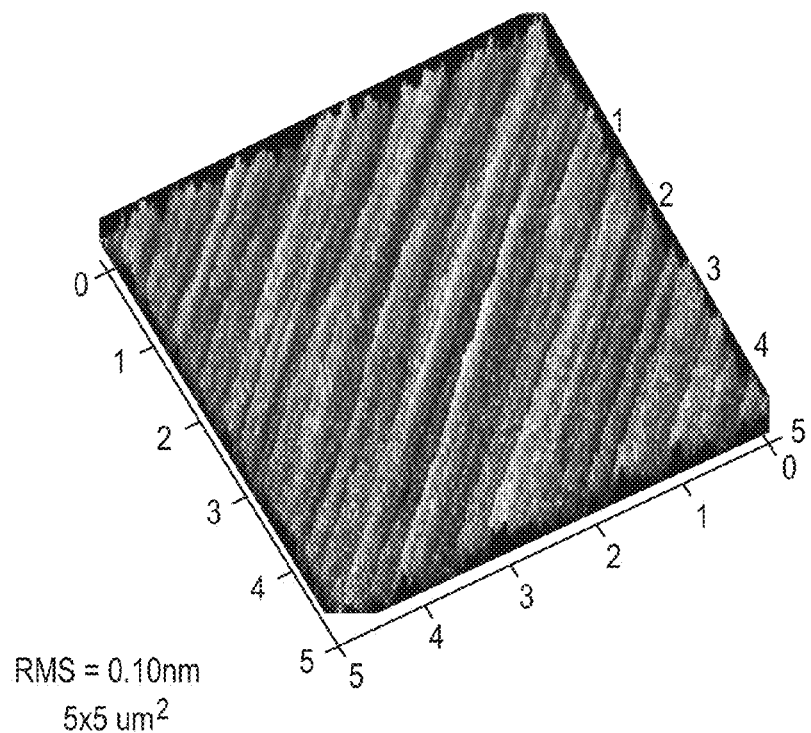

FIG. 16A and FIG. 16B shows AFM surface morphology for multilayer growth using a first $N_2$ carrier gas and a second $H_2$ carrier gas on (20-21) according to an example of the present invention. As shown, the photographs illustrate 5 μm×5 μm atomic force microscope images of n-type cladding growth on (20-21) comprising two layers. The first layer is approximately 1 μm thick using $N_2$ carrier gas and the second layer is approximately 1 μm thick using an $H_2$ carrier gas. Since the RMS roughness is maintained at 0.1 nm, this demonstrates that smooth $H_2$ growth can be achieved by initiating with $N_2$ growth.

In a specific embodiment, the present invention provides a high quality film overlying an off-cut surface having a semipolar crystal orientation. In an example, the film is grown at pressure ranging from 650-850 Torr. In an example, the present invention provides for processing such that a substantial portion of the n-cladding region is epitaxially grown using primarily an $N_2$ type carrier gas, and possibly with other species. The present invention can also provide for a growth pressure of at least an active layer is above atmospheric pressure ranging from 800 Torr to 1600 Torr. In a specific example, the present invention also includes an offcut between negative 13 degrees and negative 17 degrees from m-plane toward a c-plane, an offcut between 2 degrees and 8 degrees from m-plane toward an a-plane, atmospheric growth pressure of between 650 Torr to 850 Torr, a device capable of emission in the blue region of 420 nm to 485 nm or in the green region of 500 nm to 550 nm. The high quality film is provided for a laser device aligned in the projection of the c-direction, but can be others.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical device comprising:
a gallium and nitrogen containing substrate member having an off-axis m-plane oriented crystalline surface plane, the off-axis m-plane oriented crystalline surface plane ranging from about +/−0.6 degrees to about +/−20 degrees toward a c-plane;
a gallium and nitrogen containing epitaxial layer formed overlying the off-axis m-plane oriented crystalline surface plane configured using at least a substantially atmospheric pressure epitaxial formation process to form at least a region of a quantum well having a thickness of at least 1.5 nanometers; and
a surface region overlying the gallium and nitrogen containing epitaxial layer, the surface region being substantially free from hillocks.

2. The device of claim 1, wherein the gallium and nitrogen containing epitaxial layer comprises multiple layers, wherein the multiple layers comprise n-type regions, p-type regions, and/or multiple quantum wells.

3. The device of claim 1, wherein the substantially atmospheric pressure ranges from about 650 Torr to 900 Torr.

4. The device of claim 1, wherein the hillocks comprise one or more elongated hillocks oriented in an a-direction.

5. The device of claim 1, wherein the hillocks comprise one or more pyramidal-like hillocks.

6. The device of claim 1, wherein the gallium and nitrogen containing epitaxial layer comprises a surface region that is substantially free from hillocks.

7. The device of claim 1, wherein the gallium and nitrogen containing epitaxial layer comprises a surface region that is substantially free from hillocks having a length ranging from 10 microns to 100 microns.

8. The device of claim 1, wherein the gallium and nitrogen containing epitaxial layer comprises the surface region that is substantially free from hillocks having a length ranging from 100 microns to 200 microns.

9. The device of claim 1, wherein the gallium and nitrogen containing epitaxial layer comprises a surface region, wherein at least 90% of the surface region is free from hillocks.

10. The method of claim 1, wherein the epitaxial layer is formed using a pure nitrogen entity carrier gas.

11. The device of claim 1, wherein the off-axis m-plane oriented crystalline surface plane is greater in magnitude than about 1 degree toward (0001).

12. The device of claim 1 wherein the off-axis m-plane oriented crystalline surface plane is greater in magnitude than about 3 degrees toward (0001).

13. The device of claim 1 wherein the off-axis m-plane oriented crystalline surface plane is greater in magnitude than about 5 degrees toward (0001).

14. The device of claim 1 wherein the off-axis m-plane oriented crystalline surface plane is greater in magnitude than about 10 degrees toward (0001).

15. The device of claim 1 wherein the off-axis m-plane oriented crystalline surface plane is greater in magnitude than about 15 degrees toward (0001).

16. The device of claim 1, wherein the off-axis m-plane oriented crystalline surface plane is characterized by a semipolar plane selected from the (30-31) plane, the (30-3-1) plane, the (20-21) plane, the (20-2-1) plane, the (30-32) plane, and the (30-3-2) plane.

17. The device of claim 1, wherein the optical device is an LED device configured to operate in the blue wavelength regime from 430 nm to 480 nm or in the green wavelength regime from 500 nm to 550 nm.

18. The device of claim 1, wherein the optical device is a laser diode device configured to operate in the blue wavelength regime from 430 nm to 480 nm or in the green wavelength regime from 500 nm to 550 nm.

* * * * *